United States Patent [19]

Lewis et al.

[11] Patent Number: 5,147,787
[45] Date of Patent: Sep. 15, 1992

[54] RECOVERY OF IMAGEABLE POLYACETYLENES FROM BINDER CONTAINING AQUEOUS DISPERSIONS

[75] Inventors: David F. Lewis, Monroe, Conn.; Robert D. Schenfele, Caldwell, N.J.

[73] Assignee: ISP Investments Inc., Wilmington, Del.

[21] Appl. No.: 228,426

[22] Filed: Aug. 5, 1988

[51] Int. Cl.$^5$ .................... C12P 1/00; C07K 3/12; C12N 9/48; C12N 9/78
[52] U.S. Cl. ..................... 435/41; 435/273; 435/272; 435/212; 435/227; 435/19; 435/20; 435/495
[58] Field of Search ............... 435/266, 227, 228, 273, 435/272, 267, 212, 195, 41; 430/19, 20, 495

[56] References Cited

U.S. PATENT DOCUMENTS

| | | | |
|---|---|---|---|
| 3,131,130 | 5/1964 | Oneson | 435/273 |
| 3,501,378 | 3/1970 | Shinkai | 435/273 |
| 4,066,676 | 1/1978 | Bloom et al. | 430/495 |

FOREIGN PATENT DOCUMENTS 2606638  5/1988  European Pat. Off. .

*Primary Examiner*—Irene Marx
*Attorney, Agent, or Firm*—Marilyn J. Maue; Joshua J. Ward

[57] ABSTRACT

This invention relates to a process for the recovery of a substantially insoluble, radiation imageable polyacetylene dispersion in aqueous binder which comprises contacting the dispersion with a proteolylic enzyme in an amount sufficient to decompose the binder, at a pH of from about 3 to about 9 and a temperature of between about 20° C. and about 70° C. and separating polyacetylene solids from the resulting liquid mixture, and which solids can be solubilized and recrystallized for further use.

15 Claims, No Drawings

RECOVERY OF IMAGEABLE POLYACETYLENES FROM BINDER CONTAINING AQUEOUS DISPERSIONS

BACKGROUND OF THE INVENTION

In the manufacturing of radiation sensitive polyacetylene dispersions used in the manufacture of processless electrom beam and radiation sensitive films there is a need for the recovery of the valuable image former from aqueous dispersions of binders wherein crystalline particles of the polyacetylene are fixed. More specifically, when the dispersion fails to meet specifications required for radiation sensitive films, the ability to recover the water insoluble polyacetylenic imaging component would represent a significant savings in production costs. Such a recovery process would be employed for all off-specification manufacturing batches and scrap material such as film coating residue and washings from dispersion forming and coating equipment.

Accordingly, it is an object of this invention to provide a process for the recovery of imageable crystalline polyacetylenic compounds from a radiation sensitive dispersion by a commercially feasible and economic process.

Another object is to recover a water insoluble crystalline polyacetylene from a radiation sensitive polyacetylene dispersion in high yield and purity.

These and other objects of the invention will become apparent from the following description and disclosure.

THE INVENTION

In accordance with this invention, a crystalline, water insoluble, radiation imageable polyacetylene compound is recovered from an aqueous dispersion of said polyacetylene in an amino acid binder by contacting the dispersion with a proteolytic enzyme at a temperature of between about 20° C. and about 70° C. and a pH within a range from about 3 to about 9 for a period sufficient to hydrolyze amido linkages of the binder, e.g. a period of from about 10 minutes to about 5 hours. On completion of the hydrolysis reaction, the decomposed binder products, e.g. amino acids, are dissolved in the water phase which is easily separated from the insoluble polyacetylene solid by a convenient method, e.g. filtration. The recovered polyacetylenic filter cake is dried to produce the product of the process in high yield and in a purity exceeding 90%. This product can then be recrystallized from a suitable solvent, e.g. a hydrocarbon such as pentane, hexane, heptane, octane; an ether such as methylethyl ether, diethyl ether, tetrahydrofuran, and polyethers, e.g. dimethyoxy ethylene glycol, an alcohol such as methanol, ethanol, pentanol; an aromatic solvent such as benzene, toluene, xylene or a chlorinated hydrocarbon such as carbon tetrachloride, carbon tetrafluoride, chloroform, trichloroethylene, etc. and mixtures thereof.

The imageable polyacetylenic dispersions of the present invention are generally those containing between about 1 and about 50% of the polyacetylene solids which are mixed with a binder containing an amido linkage which polyacetylene and binder are dispersed in between about 55% and about 98% by weight water to provide a dispersion containing between about 1 weight % and about 70 weight %, preferably between about 2 weight % and about 20 weight %, total solids. These dispersions may additionally contain up to about 5% miscellaneous components such as surfactants, viscosity, controlling agents, leveling agents, dispersing agents and the like. In the dispersion, the weight ratio of polyacetylene compound to binder can vary between about 10:1 and about 1:10, although about equal amounts of the polyacetylene and binder are generally preferred. A typiical dispersion contains between about 1 weight % and about 10 weight % polyacetylene and between about 1 weight % and about 10 weight % of binder.

Polyacetylenic compounds employed in the present dispersions are those containing multiple 1,3-diyne linkages and which are substantially water insoluble compounds. The preferred polyacetylene compounds are conjugated diynes, most preferably hydrocarbon or acid diynes containing from 20 to 30 carbon atoms. A general formula for suitable acetylenic compounds of this invention is represented by the formula $A-(CH_2)_n-C\equiv C-[-C\equiv C-(CH_2)_m-C\equiv C-]_p-C-(-CH_2)_{n'}-B$ wherein m, n and n' are each independent integers having a value of from 0 to 14; p has a value of from 0 to 4; and A and B are independently methyl or carboxyl groups. Specific examples of such polyacetylenes include pentacosa-10,12-diynoic acid; 13,15-octacosadiyne and docosa-10,12-diyne-1,22-dioic acid. Of these, pentacosa-10,12-diynoic acid is most preferred since it provides unusually high sensitivity to electron beam exposure. It is to be understood however, that dispersions of other normally crystalline, color developing polyacetylenes having a conjugated structure can be present alone or in admixture with the preferred diynes in the dispersions of the present invention. Such compounds include the diynes of the above structure wherein the A and/or B moieties, in addition to lower alkyl or carboxyl, also can be hydroxy, an aliphatic or aromatic carboxylate ester group having up to 10 carbon atoms, a mono- or di- valent carboxylate metal salt group, halo, carbamyl, lower alkyl substituted carbamyl or tosyl, as well as the corresponding triyne and tetrayne products of the above polyacetylenes having from 20 to 60 carbon atoms and a conjugated structure. Examples of these compounds include 10,12-docosadiynediol, the ditoluene-p-sulfonate of 9,11-eicosadiynoic acid, the monoethyl ester of 10,12-docosadiynedioic acid, the sodium or potassium salt of 10,12-pentacosadiynoic acid, 10,12-docosadiyne chloride, 10,12-pentacosadiyne (m-tolylurethane), 10,12-pentacosadiyne {[(butoxylcarbonyl)methyl]urethane}, N-(dimethyl)-10,12-pentacosadiynamide, N,N'-bis($\alpha$-methylbenzyl) 10,12-pentacosadiyndiamide, etc. The polyacetylenic compounds are present in microcrystalline form and these crystals are dispersed, in a non-solvating liquid binder, preferably as an aqueous solution of a colloid or gel for coating on a suitable substrate.

The binder portion of the dispersion comprises natural or synthetic nitrogen containing plastics, resins, waxes, colloids, gels and the like including gelatins, desirably photographic-grade gelatin, polyvinyl-lactams, acrylic and methacrylic amide polymers, and numerous other known photographic binder materials containing an amido moiety.

The enzymes employed in the present process are of the amino acid hydrolyzing type represented by the proteases which are operative at a pH within the range of from about 3 to about 9 at a temperature of from about 20° up to about 75° C. These enzymes include species such as pepsin, rennin, trypsin, chymotrypsin, papain, ficin, bromelin, etc. as well as $\alpha$-amylases, such as erepsin, milezyme and gelatinase which solubilize gelatin. The enzymes include endopeptidases and exopeptidases which act on non-terminal and terminal amino sites of the binder component. Particularly preferred of this group are bromelin and milezyme, e.g. MILEZYME APL-440 having an activity number of RGC-6 CL-291. The present enzymes in active form can be employed in a non-diluted or in diluted state up to 100 parts of solvent per part of enzyme; however, a dilution of not more than 8 parts per part is recommended for most efficient operation of the process. Suitable enzyme diluents include lactose, dextrose, glucose, simple sugars etc.

The process of this invention is carried out at about atmospheric pressure with agitation at an elevated temperature below that at which the enzyme becomes inactive. Generally a temperature within the range of between about 25° and about 70° C. is suitable, although a temperature of between about 30° C. and about 65° C. is preferable. The pH is also an important factor in the process and must be maintained at a level at which the enzyme activity is maintained. For example gelatinase is most effective at a pH between about 6 and about 8; whereas the optimum for bromelin and Milezyme is between about 5 and 8. In the above process, the weight ratio of enzyme to binder is generally between about 0.01:1 and about 1:1; preferably between about 0.05:1 and about 0.2:1.

After treatment of the dispersion with the enzyme to hydrolyze binder, e.g. for a period of from about 0.5 to about 5 hours, preferably from about 1 to about 3 hours, the mixture can be directly cooled and solid product recovered or the enzyme can be deactivated prior to product separation. Enzyme deactivation can be effected by adjusting temperature, by acidifying or by alkalizing the reaction mixture to an inactive level. Suitable acidifying agents are organic or inorganic acids such as acetic acid, hydrochloric acid, sulfuric acid, nitric acid, phosphoric acid, trifluoroacetic acid, etc. Generally, depending on the enzyme employed, a pH below 3, to about 1, deactivates the enzyme. Suitable alkalizing agents are bases which include ammonium hydroxide, ammonium chloride, sodium hydroxide, etc.

The deactivated mixture is then cooled and allowed to separate into an aqueous solution, containing binder decomposition products and polyacetylene solids. The solids are recovered from the liquid by any convenient method, e.g. by filtration, steam distillation, decantation, centrifugation, extraction, etc. and the resulting polyacetylene solids are dried to constant weight. The polyacetylene is recovered in high yield and purity. Recovery yields up to about 90% or more are achievable by the present process.

Having generally described the invention, reference is now had to the accompanying examples which illustrate preferred embodiments but which are not to be construed as limiting to the scope of the invention as more broadly described above and in the appended claims.

EXAMPLE 1

A 1000 g sample of an aqueous dispersion containing 5 weight % pentacosadiynoic acid in 5 weight % gelatin was introduced into a 3-necked two liter flask. The dispersion was stirred and heated to 50° C., and 5 g of bromelin dissolved in 45 g of lactose (activity control #SAC 7CB021) was then added and the resulting mixture stirred at 50° C. for 2.2 hours. The solution was cooled to 40° C. and acidified to a pH of 1 with 6 molar HCl. The 40° C. solution was filtered and the filter cake dried to constant weight in an oven. High pressure liquid chromatography analysis (External Standard 254 nm) indicated that the pentacosadiynoic acid product was obtained in 92.28% purity. A 75% yield of product was obtained.

EXAMPLE 2

Example 1 was repeated except that 37.5 g of the enzyme was added to the dispersion and the resulting mixture stirred for 3 hours after which the mixture was filtered at 50° C. through a Whatman #2 filter paper. The filter cake was dried to provide 53.81 g of product representing a 66.6% yield of product having 92.2% purity.

EXAMPLE 3

A 2000 g sample of an aqueous dispersion contained 5 weight % of 10,12-pentacosadiynoic acid in 5 weight % gelatin was introduced into a 3 necked three liter flask. The dispersion was stirred and heated to 50° C. after which 5.0 g Milezyme APL-440 was added to the dispersion. The dispersion was stirred at 50° C. for a 4 hour period after which the mixture was acidified to a pH of 1. The solution was cooled to 40° C. and filtered. The filter cake was dried in an oven to constant weight. The 10,12-pentacosadiynoic acid product was obtained in 80% yield and 85% purity.

EXAMPLE 4

A 2000 g sample of an aqueous dispersion containing 3% 10,12-pentacosadiynoic acid in 5 weight % gelatin was introduced into a 3 necked three liter flask. The dispersion was stirred and heated to 60° C. after which 5 grams of 100% bromelin was added to the reaction flask. Ten grams of lactose was added to the stirring mixture. The resulting mixture was maintained at 50° C. for a 3 hour period after which the mixture was acidified to a pH =1. The material was filtered yielding a filter cake composed of 95% of the contained 10,12-pentacosadiynoic acid in a high state of purity.

What is claimed is:

1. The process which comprises contacting an aqueous dispersion of a substantially water insoluble, radiation imageable, crystalline polyacetylene in a binder containing an amido linkage with an effective hydrolyzing amount of an amido hydrolyzing enzyme; hydrolyzing said amido group of said binder in said dispersion at a temperature of between about 20° and about 70° C. and at a pH of from about 3 to about 9 to form an aqueous phase and a solids phase and to solubilize said binder decomposition product in the aqueous phase and separating said polyacetylene solids from said aqueous phase.

2. The process of claim 1 wherein said binder is gelatin.

3. The process of claim 1 wherein said enzyme is a proteolytic enzyme.

4. The process of claim 3 wherein said enzyme is bromelin.

5. The process of claim 3 wherein said enzyme is milezyme.

6. The process of claim 1 wherein said polyacetylene is 10,12-pentacosadiynoic acid.

7. The process of claim 1 wherein the dispersion is contacted with the enzyme at a temperature of between about 30° and about 65° C. for a period of from about 0.5 to about 5 hours.

8. The process of claim 1 wherein the weight ratio of enzyme added to said dispersion is between about 0.01:1 and about 1:1 with respect to said binder.

9. The process of claim 8 wherein the weight ratio of enzyme to binder is between about 0.05:1 and about 0.2:1.

10. The process of claim 1 wherein said dispersion is a dispersion of from about 1.1% to about 70% total solids.

11. The process of claim 10 wherein said dispersion contains between about 1 weight % and 10 weight % polyacetylene and between about 1 weight % and about 10 weight % of binder.

12. The process of claim 10 wherein the dispersion contains between about 2% and about 20% total solids.

13. The process of claim 11 wherein the dispersion contains equal amounts of polyacetylene and binder.

14. The process of claim 1 wherein the polyacetylene solids are separated from the aqueous phase by filtration to form a filter cake.

15. The process of claim 14 wherein the filter cake is dried to constant weight and is solubilized and recrystallized.

* * * * *